United States Patent [19]

Frima et al.

[11] 4,419,561
[45] Dec. 6, 1983

[54] METAL WIRE CATHODE FOR ELECTRON BEAM APPARATUS

[75] Inventors: Heico J. Frima, Delft; Jan B. Le Poole, Voorschoten, both of Netherlands

[73] Assignee: U.S. Philips Corporation, New York, N.Y.

[21] Appl. No.: 217,885

[22] PCT Filed: Sep. 18, 1980

[86] PCT No.: PCT/NL80/00030
§ 371 Date: May 19, 1981
§ 102(e) Date: Dec. 18, 1980

[87] PCT Pub. No.: WO81/00929
PCT Pub. Date: Apr. 2, 1981

[30] Foreign Application Priority Data

Sep. 19, 1979 [NL] Netherlands .......................... 7906958

[51] Int. Cl.³ .............................................. B23K 15/00
[52] U.S. Cl. ............................................. 219/121 EB
[58] Field of Search ................ 219/121 EB, 121 EM, 219/121 ER, 121 ES, 121 ET; 313/146, 459; 250/492.2, 311, 307

[56] References Cited

U.S. PATENT DOCUMENTS 3,466,487 9/1969 Davis et al. ......................... 313/146
3,745,342 7/1973 Le Poole ............................. 250/311
4,151,422 4/1979 Goto et al. ........................ 250/492.2

*Primary Examiner*—C. L. Albritton
*Attorney, Agent, or Firm*—Robert J. Kraus

[57] ABSTRACT

An electron beam source including a longitudinally-displaceable cathode wire having one side disposed nearby an apertured anode for emitting electrons through the aperture during heating of the wire by an energy beam. The emitting side is flattened to limit divergence of the emitted electrons.

5 Claims, 6 Drawing Figures

METAL WIRE CATHODE FOR ELECTRON BEAM APPARATUS

BACKGROUND OF THE INVENTION

The invention relates to an electron beam apparatus, comprising an electron source which comprises a metal wire which is displaceable in the longitudinal direction and which is to be locally heated by an energy beam, and also comprising a beam-limiting diaphragm which is disposed near the wire and which carries a positive potential with respect to the wire.

An electron beam apparatus of this kind is known from U.S. Pat. No. 3,745,342. In an apparatus described therein, a metal wire which is heated, for example, by means of an electron beam or a laser beam, is used as a cathode for the apparatus. In order to ensure an adequate service life of the source, the metal wire is displaced in the longitudinal direction during operation.

An electron current emerging from an extremely narrow line of such a metal wire exhibits a comparatively large spread in the emission direction in the case of a wire having a circular cross-section of small dimension. Because a lens for further processing of the electron beam inherently has a spherical aberration which is comparatively large with respect to the line thickness, a beam-limiting diaphragm is required in order to form a target spot having a small dimension in at least one direction.

Due to such large directional spread, however, a diaphragm of this kind is likely to transmit an insufficient part of the beam current. In the known electron beam apparatus, therefore, in order to obtain an acceptable service life of the source, limitations must be imposed which adversely affect aspects of the target spot quality such as maximum current density and minimum spot size.

SUMMARY OF THE INVENTION

It is an object of the invention to provide an electron beam apparatus in which these limitations are substantially reduced and in which, consequently, a target spot of higher quality can be realized whilst an acceptable service life of the source is maintained. To this end, steps are taken to reduce the directional spread in an electron beam to be emitted by the metal wire.

In order to reduce the directional spread of the electron beam, use can be made of a strong focusing field, which is to be applied near the metal wire. For the application of an electrostatic field, the wire can then be mounted between two plates which are arranged in parallel and which exhibit a large potential difference with respect to each other. For example, the plates can include a first plate which is strongly negative with respect to the wire and a second plate, having an aperture, which is strongly positive with respect to the wire. However, it has been found that the potential differences become unpractically high for suitable operation. This drawback can be eliminated by utilizing a magnetic quadrupole field for the realignment, but this solution necessitates extremely accurate positioning of the wire in the magnetic field, so that the stability of the source is affected. The required strength of the lens near the cathode is also an unfavourable factor in both said solutions.

In a preferred embodiment of an electron beam apparatus in accordance with the invention, the transverse profile of the wire is shaped so that the electron beam emitted exhibits a smaller directional spread upon emission. It has been found that a strip-shaped, commercially available metal wire is not stable during the strong local heating, so that the position and the shape of the emissive surface can vary in an uncontrolled manner with respect to the beam-limiting diaphragm. The field strength near the surface, necessary for carrying off the emitted electrons, then becomes comparatively low. As is known, the field strength on a surface in a field space is greatly dependent of the radius of curvature of the surface. A preferred embodiment of the metal wire is produced by flattening the outer surface of a round metal wire at the area where the electron emission is to occur. This can be accomplished, for example, by the rolling of a circular wire. The degree of flattening enables a favourable compromise to be reached between the surface field strength and the residual directional spread. An ellipticity of approximately from 1.5 to 2.5 has been found to offer satisfactory results in a configuration of the source as described in U.S. Pat. No. 3,745,342.

BRIEF DESCRIPTION OF THE DRAWING

Some preferred embodiments of electron beam apparatus in accordance with the invention will be described in detail hereinafter with reference to the accompanying diagrammatic drawing, in which.

DESCRIPTION OF THE PREFERRED EMBODIMENTS

Figure 1:
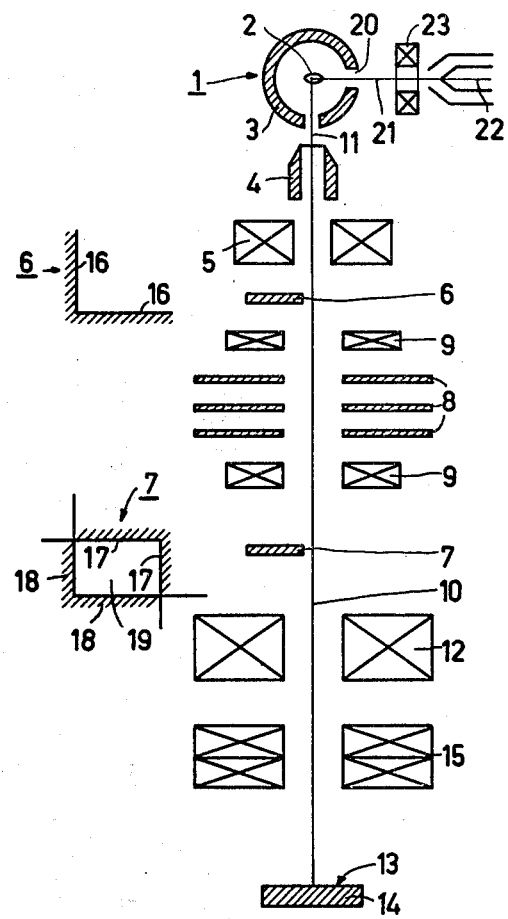
FIG. 1 shows a preferred embodiment in the form of an electron beam machining apparatus.
Figure 3A:
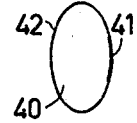
FIGS. 3a–3d show sectional views of some embodiments of cathode wires for such an electron source.
Figure 3B:
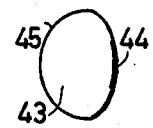
Figure 3C:
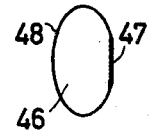
Figure 3D:
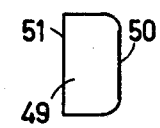

An electron beam machining apparatus as shown in FIG. 1 comprises an electron source 1, including a wire cathode 2, an anode sleeve 3, a second anode 4, and a condensor lens 5. The apparatus further comprises a first diaphragm 6, a plan view of which is also shown for the sake of clarity, and a second diaphragm 7 which is also shown in a plan view. The first diaphragm can be imaged onto the second diaphragm by means of an electron-optical lens system 8. This image can be shifted, by means of a beam deflection device 9, in the plane of the second diaphragm in order to make the centre of the beam coincide with the centre of the diaphragm aperture. A beam portion 10 of the electron beam 11 which is transmitted by the second diaphragm can be imaged, in strongly reduced form, by means of a collimating lens 12 onto a surface 13 of an object 14 to be machined. For machining the surface 13, the beam can be displaced across the surface in a pattern by means of a beam deflection system 15. The first diaphragm 6 is shaped, for example, as a rectangle, two sides 16 of which have a beam limiting effect. This diaphragm is imaged onto the second diaphragm 7 which in this case is also shaped as a rectangle. The sides 17 thereof also have a beam-limiting effect, so that beyond the two diaphragms, the beam is limited to a transmission aperture 19 which is formed and adjustable by the sides 17 of the diaphragm 7 and an image 18 of the diaphragm 6. The function of the electron source is to realize a high current density in this beam.

The cathode 2 is in this case formed by a metal wire, at least one side of the surface of which is flattened and which is assumed to extend perpendicularly to the plane of the drawing in FIG. 1. This metal wire is laterally irradiated, via an aperture 20, by an electron beam 21 which is generated by a source 22 and which is directed by means of a coil 23. The wire is thus locally heated to a temperature of, for example, 3400° C. for a tungsten wire having an emission temperature of approximately 2800° C.

Figure 2:
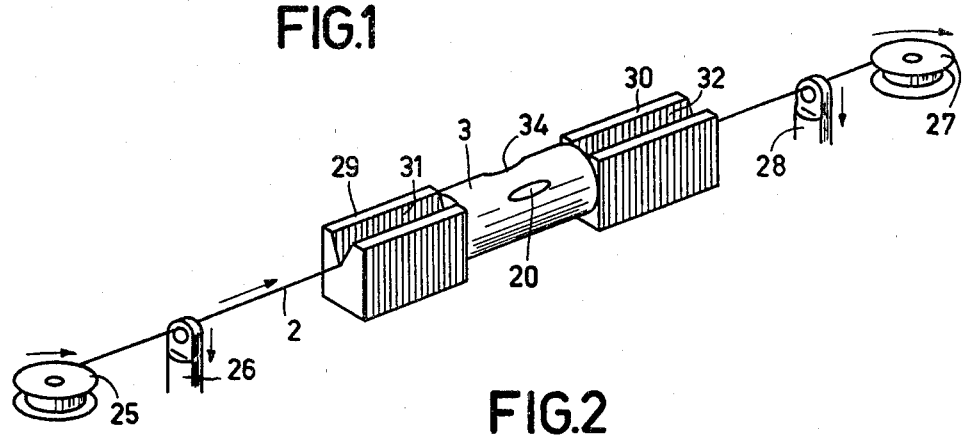
FIG. 2 shows an embodiment of an electron source for each an apparatus.

FIG. 2 is a diagrammatic perspective view of the electron source 1 of the preferred embodiment shown in FIG. 1. The metal wire 2 moves, under the influence of a tensile force which is exerted in the longitudinal direction and which keeps the wire straight in all circumstances, between a reel 25, cooperating with a guide 26, and a reel 27 which cooperates with a guide 28. Around the metal wire there are arranged two supporting blocks 29 and 30, each of which comprises a V-groove 31, 32, respectively, which provide exact guiding of the metal wire 2 in the longitudinal direction. Abutment faces in the supporting blocks 29 and 30, preferably adapted to the profile of the wire, prevent the wire from rotating between the blocks, so that the flattened portion always remains directed exactly toward a transmission aperture 34 in the anode sleeve 3. The supporting blocks are preferably in thermal contact with the metal wire and are made of a metal having suitable thermal conduction properties, for example, silver. Between the supporting blocks, the anode 3 is arranged around the wire, the anode being shaped as a hollow cylinder having an inner diameter of, for example, from 0.5 to 2 mm and a wall thickness of, for example, from 0.2 to 0.5 mm. The anode is integral with the supporting blocks in this embodiment. The aperture 34 can be adapted to requirements concerning the dimensions of the electron source in the longitudinal direction and is dimensioned, for example, 50×500 μm.

During operation, the anode 3 has a potential of, for example, from +300 to +700 V the potential of the metal wire 2 being zero.

Even though the invention has been described with reference to an electron beam machining apparatus for microcircuits, for which it is particularly attractive, the range of application is wider and also covers, for example, electron beam machining apparatus for materials working, such as the drilling of exactly defined holes or patterns.

In an apparatus of this kind, if desired, the length and the width of the target spot can be controlled to desired dimensions of a structure to be inscribed, so that a substantial amount of working time is saved. The length and the width of the target spot can be determined by means of an electron-optical device as described with reference to FIG. 1. A square or elongate target spot can thus be formed even with a round aperture 34.

FIG. 3 shows some profiles of cathode wires. FIG. 3a shows a profile 40 in the form of an ellipse which in this case has an ellipticity of 1.5. An emissive surface 41 is situated centrally on the flattest part of the ellipse, the wire being irradiated in order to be heated, for example on an elliptical surface 42. A profile 43 as shown in FIG. 3b has an elliptical surface 44 as the emissive surface, whilst the oppositely situated surface 45 is circular. FIG. 3c shows a profile 46 in which an emissive portion 47 comprises a flat part. The oppositely situated surface 48 may then be shaped like the emissive surface, or be elliptical or circular. Each of these three profiles can be formed by the rolling of an originally round wire, the differences between the emissive part and the oppositely situated part being obtained by a suitable choice of the hardness and/or the shape of the roller surfaces used. Even though it is less suitable for many applications, because of the comparatively large beam errors, a concave emissive surface can thus also be realized. FIG. 3d shows a wire profile 49 which is based on a rectangular band. An emissive surface 50 may be slightly rounded, whilst an oppositely situated surface 51 can be maintained completely flat, thus resulting in a suitable target surface of the wire.

What is claimed is:

1. An electron beam source comprising a longitudinally-displacable cathode wire, an anode having an aperture disposed adjacent one side of the wire, and means for applying an energy beam to a portion of the wire to effect electron emission from said side through the aperture, said side having a flattened surface for minimizing the divergence of electrons emitted thereby.

2. An electron beam source as in claim 1 where said surface is elliptical.

3. An electron beam source as in claim 2 where the ellipticity of the surface is between 1.5 and 2.5.

4. An electron beam source as in claim 1 where said surface is planar.

5. An electron beam source as in claim 1 and further including guide means in contact with the wire for maintaining a predetemined orientation of the flattened surface relative to the aperture in the anode during longitudinal displacement of the wire.

* * * * *